United States Patent [19]

Hollingsworth et al.

[11] 4,156,940
[45] May 29, 1979

[54] MEMORY ARRAY WITH BIAS VOLTAGE GENERATOR

[75] Inventors: Richard J. Hollingsworth, Princeton; Chang S. Kim, Skillman, both of N.J.

[73] Assignee: RCA Corporation, New York, N.Y.

[21] Appl. No.: 890,703

[22] Filed: Mar. 27, 1978

[51] Int. Cl.² .............................................. G11C 7/00
[52] U.S. Cl. .................................... 365/189; 365/190
[58] Field of Search ....................... 365/190, 154, 189

[56] References Cited

U.S. PATENT DOCUMENTS 4,063,225 12/1977 Stewart ................................ 365/190

OTHER PUBLICATIONS

Hollingsworth, "Memory Cell", RCA Technical Notes, No. 1125, 8/28/75.

*Primary Examiner*—Stuart N. Hecker
*Attorney, Agent, or Firm*—H. Christoffersen; Henry I. Schanzer

[57] ABSTRACT

A bias generator produces a voltage ($V_R$) which is applied to the control electrode of a gating transistor via whose conduction path the contents of a memory cell are read-out. $V_R$ is such that, during read-out, the maximum amplitude of the gate-to-source potential ($V_{GS}$) applied to the gating transistor, in a direction to turn it on, is approximately equal to a fraction of the memory cell supply voltage plus an offset voltage comparable to the threshold voltage ($V_T$) of the gating transistor. The bias generator includes a voltage divider connected across the same supply voltage source as the memory cell. A portion of the supply voltage ($K\ V_{DD}$) generated at a node of the divider is applied to an offset voltage generating circuit which includes at least one device of the same type as the gating transistor and which produces $V_R$ at its output. $V_R$ is approximately equal to $K\ V_{DD}$ offset by a voltage comparable to the $V_T$ of the gating transistor. Applying $V_R$ to the gating transistor enables the contents of the memory cell to be read out non-destructively since the ON impedance of the gating transistor is controlled over a wide range of supply voltage variation and for a wide range of device characteristics.

10 Claims, 4 Drawing Figures

MEMORY ARRAY WITH BIAS VOLTAGE GENERATOR

This invention relates to semiconductor memory arrays and, in particular, to means for non-destructively reading the contents of the cells of a memory array.

In the design of large memory arrays, a critical parameter is the largest number of memory cells that can be put on a chip, i.e., the packing density. To achieve a high packing density, the number of devices per memory cell must be small and the number of lines to access the cells must be as few as possible.

A known static memory cell which satisfies these general requirements includes five (5) transistors per cell and is shown, for example, in FIG. 5 of U.S. Pat. No. 3,521,242 entitled, "Complementary Transistors Write and NDRO for Memory Cell". Four of the five transistors are connected to form a flip-flop. The fifth transistor referred to herein as the "gating" transistor functions as a transmission gate. Its conduction path is connected between a single input-output (I/O) point to the flip-flop and an I/O line and it is used either to sense the state of the cell or to write information into the cell. The cell has many advantages in that it is small, it can be selected by one word line connected to the control electrode of the gating transistor, and information can be written into the cell and its contents can be sensed by means of the one I/O line.

However, accompanying these advantages are many problems and conflicting design requirements. To write into the cell, the impedance of the gating transistor must be made as low as possible to enable the cell to change state and to accept new information during a write operation. But, when reading the information contained in the cell, it is necessary that the gating transistor have a relatively high impedance in order to prevent the information on the I/O line from overriding and altering the contents of the memory cell.

Techniques have been developed in the prior art for minimizing the above problem. One technique is to make the impedance of the gating transistor high so the cell can be read out non-destructively. When it is desired to write information into the cell various approaches may be used. U.S. Pat. No. 3,521,242, mentioned overdriving the control electrode of the gating transistor to lower the impedance of its conduction path to ensure tighter coupling. This, however, requires the availability of a higher amplitude potential, or the generation of a higher amplitude potential, than the memory cell operating potential. Also, applying pulses of high amplitude to the address lines increases transient spikes and the noise level in the circuit making it more susceptible to random failures. Another approach for writing into the cell is to modify its supply voltage. This is disadvantageous in that it requires special additional circuitry and may limit the range of potential over which the circuit operates. Still another technique precharging the sense lines to a voltage level that will not cause the cell to change its state when the gating transistor is turned on. But, this technique requires special additional charging circuits and may require extra timing pulses and/or dissipates more quiescent power.

In circuits embodying the invention the ON impedance of the gating transistor of a memory cell is controlled, during the read cycle, by the application of a bias voltage ($V_R$) to its control electrode. $V_R$ is generated as follows. A voltage divider is connected across a source of supply voltage. A fraction of the supply voltage generated at a node of the divider is applied to an offset voltage generating circuit which includes at least one device of the same type as the gating transistor and which produces $V_R$ at its output. $V_R$ is equal to a fraction of the supply voltage minus a voltage offset term, which offset term is comparable to the $V_T$ of the gating transistor.

In the accompanying drawing,

FIG. 1 includes a schematic diagram of a bias generator and a semi-schematic semi-block diagram of a decoding arrangement and memory array embodying the invention;

Figure 1:
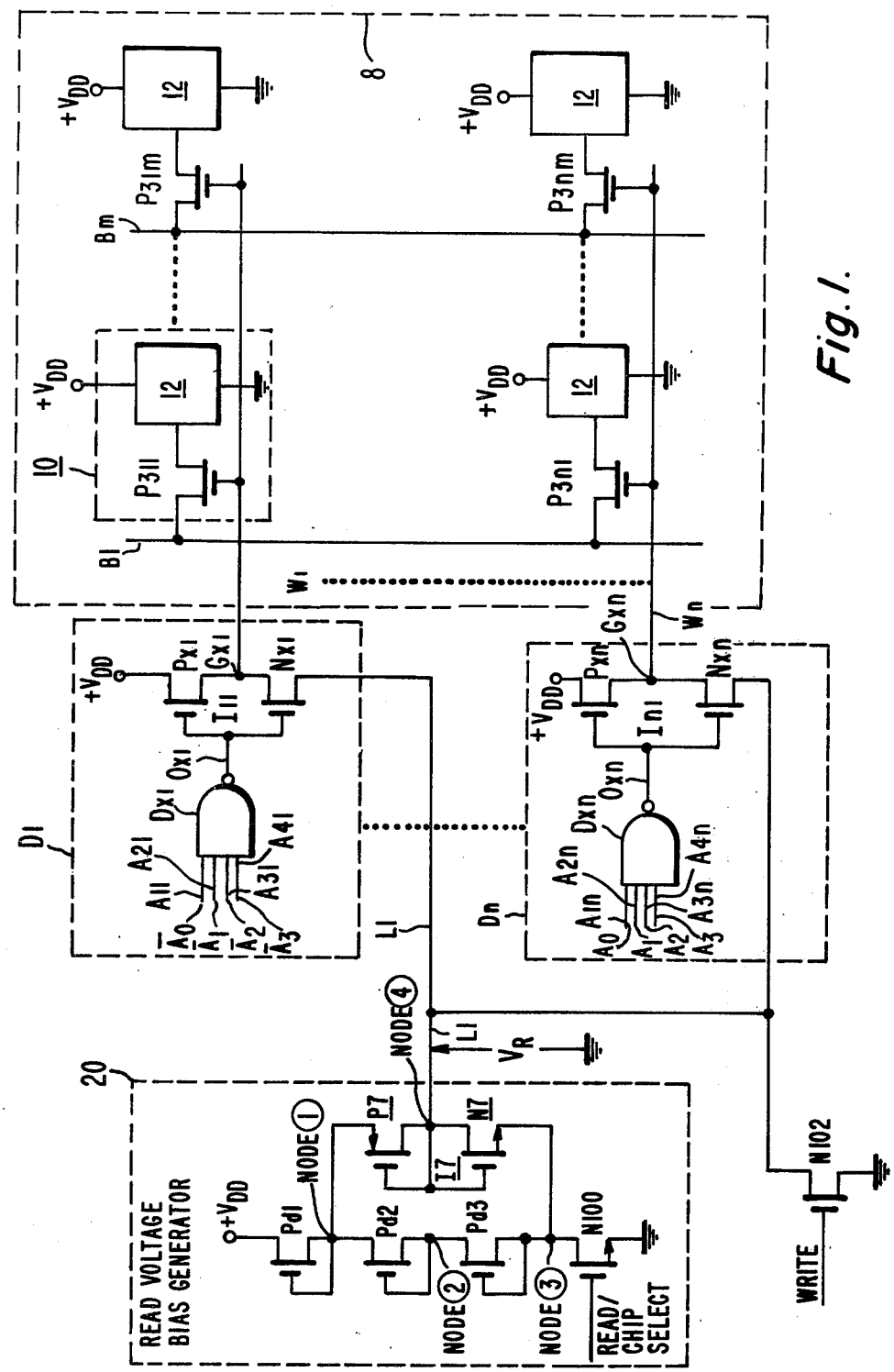

The active devices which are preferred for use in practicing the invention are those of a class known in the art as insulated-gate field-effect transistors (IGFETs). For this reason, the circuit is illustrated in the drawing as employing such transistors and will be so described hereinafter. However, this is not intended to preclude the use of other suitable devices and to this end, the term "transistor", when used without limitation in the appended claims, is used in a generic sense.

In the FIGURES, enhancement type IGFETs of P conductivity type are identified by the letter P followed by a particular reference numeral; enhancement type IGFETs of N-conductivity type are identified by the letter N followed by a particular reference numeral; and depletion type IGFETs of P conductivity are identified by the letter P followed by the letter "d" and a particular reference numeral.

The characteristics of IGFETs are well known and need not be described in detail. But, for a clearer understanding of the description to follow, the following definitions and characteristics pertinent to the invention are set forth:

1. The IGFETs have first and second electrodes which define the ends of a conduction path and a control electrode (gate) whose applied potential determines the conductivity of the conduction path. The first and second electrodes of an IGFET are referred to as the source and drain electrodes. For a P-type IGFET the source electrode is defined as that one of the first and second electrodes having the more positive (higher) potential applied thereto. For an N-type IGFET, the source electrode is defined as that one of the first and second electrodes having the less positive (lower) potential applied thereto.

2. Conduction occurs when the applied gate-to-source potential ($V_{GS}$) is in a direction to turn-on the transistor and is greater in magnitude than a given value, which is defined as the threshold voltage ($V_T$) of the transistor. To turn on a P type transistor its gate voltage ($V_G$) has to be more negative than its source voltage ($V_S$) by at least $V_T$. To turn on a N type transistor its $V_G$ has to be more positive than its $V_S$ by $V_T$.

3. IGFETs are bidirectional in the sense that when an enabling signal is applied to the control electrode, current can flow in either direction in the conduction path defined by the first and second electrodes, i.e., the source and drain are interchangeable.

FIG. 1 includes a word-organized memory array 8 of cells 10 whose word lines (W1 ... Wn) are selectively coupled to a line L1 by means of decoders (D1 ... Dn).

Each decoder Di, where $1 \leq i \leq n$, includes a logic gate $D_{Xi}$ which may be any one of a known number of circuits which produces a unique output when all its inputs are in a given state. Four (4) input address lines ($A_{1i}$, $A_{2i}$, $A_{3i}$, $A_{4i}$) carrying binary coded information ($A_0$, $A_1$, $A_2$, $A_3$) are applied to the input of each decoder. The output $O_{Xi}$ of each decoder is connected to the gate electrodes of two clamping transistors $P_{Xi}$, $N_{Xi}$. When a word line (Wi) is selected (for read or write) all the input signals to its corresponding decoder (Di) go "low" and its output $O_{Xi}$ goes "high". If Wi is not selected $O_{Xi}$, goes, or remains, "low". The conduction path of $P_{Xi}$ is connected between the positive operating voltage $V_{DD}$ applied to the memory array, and the decoder output $G_{Xi}$. $P_{Xi}$ is turned on and clamps $G_{Xi}$ to $+V_{DD}$ volts when $O_{Xi}$ is "low" and is turned off when $O_{Xi}$ is "high". The conduction path of $N_{Xi}$ is connected between line L1 and clamps $G_{Xi}$ to L1 via a low conduction path when $O_{Xi}$ is "high". When $O_{Xi}$ is "low" $N_{Xi}$ is turned off.

During a read cycle a bias generator 20 produces a read voltage ($V_R$) at its output node 4 which is applied to line L1. During a write cycle a write switch N102 is turned-on and clamps line L1 to ground.

The bias generator will first be discussed followed by a discussion of the application of its output voltage to the gating transistors of the memory cells.

The bias generator 20 includes a voltage divider network comprising three depletion type PMOS transistors, Pd1, Pd2 and Pd3, whose conduction paths are connected in series with the conduction path of a switching transistor N100 between $+V_{DD}$ and ground. N100 is turned on during each read/write cycle by a positive going chip select control signal applied to its gate. N100 is made to have a much higher conductance than the other transistors of the bias generator. Hence, it is assumed that its ON impedance is negligible in comparison to that of transistors Pd1, Pd2 and Pd3, as well as that of transistors P7, N7.

Figure 2:
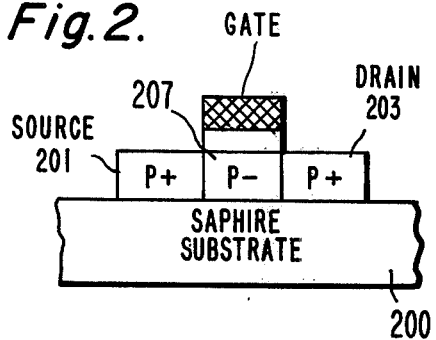
FIG. 2 is a cross section of a depletion type transistor used in the bias generator of FIG. 1.

The depletion type transistors may each be fabricated on a sapphire substrate 200 as shown in FIG. 2. Each transistor is made by the diffusion of P+ regions to form the source 201 and drain 203 regions of the transistor. The P− region 207 between the source and drain regions defines the channel region of the device and is the region through which conduction takes place. Overlying the channel region is a silicon dioxide (insulation) layer on top of which is formed a gate electrode of conductive material. Transistors Pd1, Pd2, Pd3 are fabricated under the same or similar conditions and have the same width (W) to length (L) ratio so their characteristics are similar.

Referring back to FIG. 1, the gate of each depletion transistor is connected to its drain. For a P-type depletion transistor to be turned off it has to be reverse biased (i.e., its gate voltage, $V_G$ has to be more positive than its source voltage, $V_S$). Connected as shown, the depletion transistors are forward biased and are turned-on for all positive values of $V_{DD}$. Consequently, as $V_{DD}$ varies over a wide voltage range (e.g. 3 volts to 15 volts) the 3 depletion transistors remain conducting and there is a voltage drop of approximately ⅓ $V_{DD}$ across each one of their conduction channels (paths). Since the depletion transistors are made in a similar manner, are placed in the same environment, and are operated at approximately equal bias levels, they vary in a similar manner as a function of time, temperature, and change in device parameters. Hence, the division ratio across the devices is maintained over a wide range of voltage and temperature. Depletion mode transistors were selected for the divider network to permit operation down to $V_{DD}=3$ volts with no problem of cut off. If enhancement type PMOS devices had been used instead, operation at the low voltage end would not be possible. P type enhancement transistors typically have $V_T$'s in the order of −1.1 volt. Thus, three enhancement devices could not function as a voltage divider, when the operating voltage ($V_{DD}$) decreases below 3.3 volts.

The junction of the conduction path of transistors Pd1 and Pd2 defines node ① at which is produced a voltage ($V_1$) which, for ease of description, is assumed to be equal to ⅔ $V_{DD}$ so long as transistor N100 is turned on. The junction of Pd2 and Pd3 defines node ② at which is produced a second voltage ($V_2$) which is assumed to be equal to ⅓ $V_{DD}$ so long as N100 is turned on. The junction of the conduction path of Pd3 and N100 defines node ③ which is assumed close to ground potential when N100 is turned on.

A self-biased complementary inverter I7 is connected between nodes 1 and 3. Inverter I7 includes transistors P7 and N7 connected at their source electrodes to nodes 1 and 3, respectively. Their drain and gate electrodes are connected in common to node 4 at which is produced the output voltage ($V_R$) of the bias generator. Transistor P7 is made much larger than transistor N7 (W/L of P7 > W/L of N7) whereby the voltage at the output of inverter I7 is approximately equal to the voltage (⅔ $V_{DD}$) applied to the source of transistor P7 minus the threshold voltage ($V_{TP}$) of transistor P7. $V_R$ may be expressed more exactly as follows:

$$V_R = \tfrac{2}{3} V_{DD} - V_{TP} - \Delta \qquad \text{Eq. 1}$$

where Δ is a factor depending upon the ratio of the sizes and mobilities of transistors P7 and N7. For P7 much larger than N7, Δ is negligible and will be ignored in the discussion to follow. Furthermore, for ease of description the amplitude of the threshold voltages of all the enhancement transistors are assumed equal to $V_T$, (i.e., $V_{TP}=V_{TN}=V_T$). $V_R$ is a function of, and varies as, $V_{DD}$ varies. In FIG. 1 a P-type IGFET (P7) is used to produce the $V_T$ term in $V_R$ since the gating transistor of the memory cell 10 to which $V_R$ is applied is a P-type transistor.

$V_R$ is applied via one of the decoding gates (D1 ... Dn) to a selected one of the word line (W1 ... Wn) to which is connected the gate electrodes of the gating transistors (P3i) of that word.

The role of the bias voltage in effectuating the non-destructive read-out of the contents of a memory cell will now be examined. However, to better understand that discussion the memory cell structure and operation will first be discussed.

Figure 3:
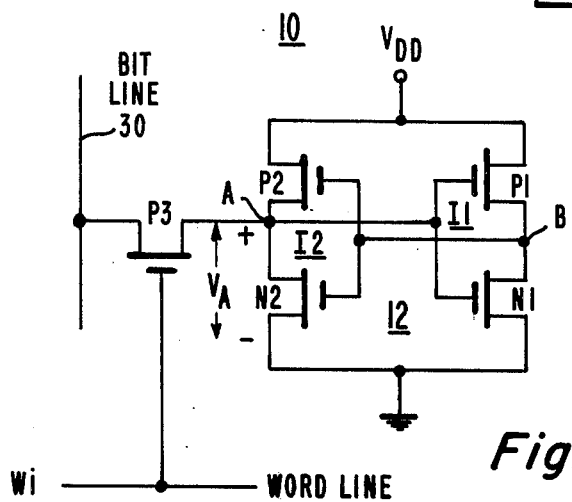
FIG. 3 is a schematic diagram of a memory cell used in the array of FIG. 1.

As shown in FIG. 3, each memory cell 10 includes two cross coupled inverters I1 and I2 forming a flip flop 12 and a gating transistor P3. Inverter I1 includes transistor P1 and N1 and inverter I2 includes transistors P2 and N2. The sources of N1 and N2 are connected to a point of reference potential, indicated as circuit ground, and the sources of P1 and P2 are connected to a point of positive operating potential, indicated as $+V_{DD}$ volts. The drains of P1 and N1 are connected to each other and to the gates of P2 and N2 at node B. In a similar manner, the drains of P2 and N2 are connected to each other and to the gates of P1 and N1 at node A.

The flip flop 12 is bistable and, in either steady state, draws no appreciable current whereby the steady state power dissipation is extremely low. When N1 and P1 have $+V_{DD}$ volts applied at their gates N1 is turned on and P1 is turned off. The voltage ($V_B$) at node B then is "low" (i.e., logic "0"—at, or close to, zero volts) and little current flows through the conduction path of P1. The low is applied to the gates of N2 and P2, turning N2 off and P2 on. The voltage ($V_A$) at node A then is "high" (i.e., logic "1"—at, or close to, $+V_{DD}$ volts), which voltage maintains N1 on and P1 off. The memory cell may then be considered to be storing a binary "1" bit. In the other stable state, N1 and P2 are turned off and N2 and P1 are turned on. $V_B$ then is $+V_{DD}$ volts, and $V_A$ is at ground potential. The memory cell may then be considered to be storing a binary "0" bit.

The conduction path of gating transistor P3 is connected between node A and an input-output (I/O) bit line 30 and its control (gate) electrode is connected to a word line $W_i$.

When a memory cell is not selected (for write or read) its word line, Wi, is clamped to $+V_{DD}$ volts via $P_{Xi}$. The gating transistor P3 is then turned off, and the memory cell is electrically isolated from line 30. When a memory cell is selected, Wi is clamped to line L1 via $N_{Xi}$. If information is to be written into the cell line L1 is clamped to ground. If the memory cell is to be read, L1 is at $V_R$ volts.

The operation of the memory cell will be discussed assuming the memory cell devices to have the dimensions listed below.

|   | P1 | P2 | P3 | N1 | N2 |
|---|---|---|---|---|---|
| W | .15 mils | .15 mils | 1.3 mils | .15 mils | .45 mils |
| L | .2 mils | .2 mils | .2 mils | .2 mils | .2 mils |

The impedance of the conduction path of an IGFET may be expressed approximately as follows:

$$Z \approx K \frac{L}{\mu W} \cdot \left[ \frac{1}{V_{GS} - V_T} \right] \qquad \text{Eq. 2}$$

where $\mu$ is the effective surface mobility of the carriers in the conductive channels of the transistors, and where $\mu_p$ ($\mu$ for a P type IGFET) is to a gross approximation equal to $\frac{1}{2}\mu_n$ ($\mu$ for a N type IGFET). Therefore $K/\mu_p$ of a P type transistor is assumed twice the $K/\mu_n$ of an N type transistor.

Consequently, for the same amplitude of gate-to-source voltage ($V_{GS}$), applied in a direction to turn on the transistors, the ON impedance ($Z_{P3}$) of the conduction path of the gating transistor P3 is less than the ON impedance ($Z_{N2}$) of transistor N2 and much less than the ON impedance ($Z_{P2}$) of transistor P2.

It will now be shown that, for the device sizes listed above and with the gate of P3 grounded, the cell is easily writable. That is, a "0" can be written into the flip flop originally storing a "1", or a "1" can be written into the flip flop originally storing a "0". For ease of discussion, the trip point (i.e., the value of input voltage for which the output changes state) of inverter I1 is assumed to be approximately equal to $V_{DD}/2$.

Examine first the case where the flip flop is storing a "1" (i.e., P2 and N1 are turned on and P1 and N2 are turned off) and that a logic "0" (0 volts) present on line 30 is to be written into the flip flop. Node A is coupled to $V_{DD}$ via the conduction path of transistor P2. Grounding the gate of P3 causes current to flow from $V_{DD}$ via $Z_{P2}$ and $Z_{P3}$ to ground. Since $Z_{P3}$ is a much lower impedance than $Z_{P2}$, $V_A$ goes from $V_{DD}$ volts to some value which is considerably less than $V_{DD}/2$. The drop in $V_A$ causes $V_B$ to go from ground towards $V_{DD}$ volts which turns off P2 and turns on N2. The flip flop is, thus, switched and statically stores a logic "0".

Examine now the case where a "0" is stored in the flip flop (i.e., N2 and P1 are turned on and N1 and P2 are turned off) and that a logic "1" ($+V_{DD}$) present on line 30 is to be written into the flip flop. Since $Z_{P3}$ and $Z_{N2}$ are connected in series between bit line 30 and ground and $Z_{P3}$ is less than $Z_{N2}$ ($Z_{P3} \approx 0.8\ Z_{N2}$), and since bit line 30 is at $V_{DD}$ volts, $V_A$ rises above $V_{DD}/2$ causing P1 to turn off and N1 to turn on and P2 to turn ON and N2 to turn OFF. Node A is then clamped to $V_{DD}$ volts and node B to ground and a logic "1" is statically stored in the flip flop.

If the contents of the memory cell were to be read out by grounding the gate of transistor P3, the contents of the memory cell could be disturbed during read out whenever the voltage on the bit line would be at a different binary level than the bit stored in the memory cell. This is especially so in large memories where the capacitance of the I/O lines is much greater than the input capacitance of the memory cells. Destructive read-out can also occur due to the problem of multiple address selection. This occurs when the word line decoders are such that one line is enabled before another line is fully disabled. Two cells from different word lines sharing the same bit line would then be coupled to the bit line. As a result, one of the two cells could be upset by the other. To prevent the disturb or destructive read condition, the bias generator is designed to produce a controlled voltage ($V_R$) which is applied to the control or gate electrodes of the gating transistors P3 when the contents of their associated flip flop are selected to be read out. $V_R$ (i.e., $\frac{3}{8} V_{DD} - V_T$) is applied to the gate electrode of transistor P3 during the read mode, where $V_T$ is approximately equal to the $V_T$ of transistor P3. $V_R$ is the gate voltage ($V_G$) of gating transistor P3. Since the maximum source voltage ($V_S$) applied to P3 is equal to $V_{DD}$, the maximum amplitude of the gate-to-source voltage ($V_{GS}$) applied to P3 is equal to $\frac{5}{8} V_{DD} + V_T$.

$$|V_{GS}| = |V_G - V_S| = |V_{DD} - [\tfrac{3}{8} V_{DD} - V_T]|$$

$V_R$ ensures that the turn-on of P3 is controlled such that the ON impedance of its conduction channel is greater than the ON impedance of N2 when the cell is storing a zero.

The read operation will now be examined for the two conditions which can cause the memory cell to be disturbed. One condition exists when a logic "0" (node A at 0 volts) is stored in the memory cell and the bit line capacitance is charged to $V_{DD}$ volts. For this condition, P3 is operated in the common source mode. The gate of P3 is at $\frac{3}{8} V_{DD} - V_T$ its source electrode (bit line 30) is at $V_{DD}$ volts, and its drain electrode (node A) is at zero volts. $V_{GS}$ of P3 is, therefore, equal to $\frac{5}{8} V_{DD} + V_T$. Since the cell is storing a "0", transistor N2 is turned on, and its $V_{GS}$ is equal to $V_{DD}$ volts since its source electrode is at ground and since $V_{DD}$ is applied to its gate electrode. The $V_{GS}$ of N2 is, therefore, considerably greater than the $V_{GS}$ of P3. Assuming $V_T$ to be equal to one volt and $V_{DD}$ to be equal to three volts the $V_{GS}$ of P3 is two volts while the $V_{GS}$ of N2 is three volts. Hence, $Z_{P3}$ is, for the read condition, greater than $Z_{N2}$. Since $Z_{P3}$ is in series with $Z_{N2}$ between bit line 30 and ground, $V_A$ remains below $V_{DD}/2$. Since the trip point of inverter I1 is at $V_{DD}/2$, the output of inverter I1 remains high (P1 on, N1 off), N2 remains on and P2 off. Consequently, the memory cell is not disturbed.

The other possible disturb condition exists when the cell is storing a "1" (node A at $V_{DD}$) and the bit line capacitance is charged to "0" volts. $V_R$ is again applied to the gate of P3 whose source electrode (node A) is coupled to $V_{DD}$ via P2 and whose drain (bit line 30) is at ground. For this signal condition P3 conducts in the source follower mode. $V_A$ cannot go below $\frac{2}{3} V_{DD}$, because P3 turns off as soon as its source potential ($V_A$) comes within $V_T$ volts of its gate voltage ($V_R$). Furthermore, as $V_A$ drops from $V_{DD}$ towards $\frac{2}{3} V_{DD}$ the impedance of the conduction channel of P3 increases such that $V_A$ can not drop below $V_{DD}/2$. Consequently, the memory cell is not disturbed for this read out condition. Thus, $V_R$ causes the $V_{GS}$ of the gating transistor to be sufficiently large to ensure rapid read-out of the memory cell contents without allowing the contents to be disturbed.

It should be appreciated that the bias generator does not have to supply large currents to line L1 or to the word lines (Wi). The operation of the memory array is such that the word lines are normally charged to $+V_{DD}$. During a read cycle, a selected word line is discharged via transistors $N_{Xi}$, N7 and N100 towards ground potential. However, as soon as line L1 reaches $V_R$, transistors Pd1 and P7 supply current to node 4 to maintain L1 (and consequently Wi) at $V_R$. Since $V_R$ does not have to drive the line, the bias generator does not have to supply large currents to the decoder circuitry.

Figure 4:
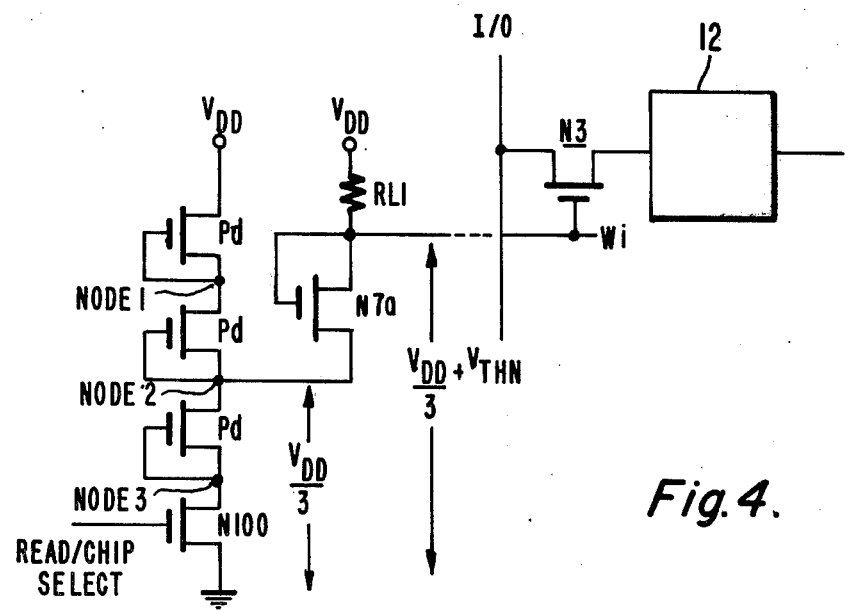
FIG. 4 is a schematic diagram of another bias generator for practicing the invention.

The circuit of FIG. 1 was illustrated using a gating transistor of P conductivity type. It should be appreciated, however, that the gating transistor could instead be of N conductivity type as shown by N3 in FIG. 4. For this type of gating transistor a $V_R$ of $V_{DD}/3 + V_T$ would be required. The bias generator could be as shown in FIG. 4. The source electrode of a transistor N7A would be connected to node 2 of the voltage divider at which is produced $V_{DD}/3$. The gate and drain of transistor N7A would be connected in common and via an impedance RL1 to $V_{DD}$ volts. For this connection the drain-to-source voltage ($V_{DS}$) is equal to $V_T$ of the transistor. Hence, the voltage produced at the drain of N7A would then be equal to $\frac{1}{3} V_{DD} + V_T$.

Transistor P7 in inverter I7 is made to have comparable characteristics to transistor P3 such that the temperature variations affecting one transistor will affect the other in a similar manner. Likewise, in FIG. 4, transistor N7A would be made in a comparable manner to transistor N3 to achieve a high degree of compensation of device parameters.

The voltage offset generator (N7A, RL1) of FIG. 4 could obviously be replaced by a self-biased complementary inverter as shown in FIG. 1, with N7A dominating the corresponding P type load transistor.

What is claimed is:

1. In combination with a memory cell having at least one input-output (I/O) point and a single gating transistor whose conduction path is connected between said I/O point and a read/write line, means for non-destructively reading the contents of the memory cell comprising:

first and second power terminals for the application therebetween of an operating potential;

a voltage divider network connected between said first and second power terminals having an output node at which is produced a first voltage which is a fraction of said operating potential;

a threshold voltage offset generator, coupled to said output node of said voltage divider, responsive to said first voltage and having an output terminal for producing thereat a second voltage whose voltage is offset with respect to the first voltage by an amount comparable to the threshold voltage of said gating transistor; and means for selectively coupling said output terminal to the control electrode of said gating transistor when the contents of the memory cell are to be read out.

2. The combination as claimed in claim 1 wherein said gating transistor is a first insulated-gate field-effect transistor (IGFET) of first conductivity type; and wherein said threshold voltage offset generator includes: a second IGFET of said first conductivity type, said second IGFET having source and drain electrodes defining the ends of its conduction path and a gate electrode; and means connecting the gate and drain electrodes of said second IGFET to said output terminal and the source electrode of said second IGFET to said output node.

3. The combination as claimed in claim 2 wherein said voltage divider network includes a plurality of depletion type transistors and means connecting their conduction paths in series between said first and second power terminals, and wherein the junction of the conduction paths of two of said plurality of depletion type transistors defines said output node, and circuit connections to the gate electrodes of said depletion transistors for biasing them into a conduction mode.

4. The combination as claimed in claim 3 wherein said depletion transistors are of the same conductivity type, are of similar construction and are formed on a sapphire substrate.

5. The combination as claimed in claim 2 wherein said threshold voltage offset generator includes a third IGFET of second conductivity type, complementary to said first conductivity type, having source, drain and gate electrodes; and wherein the gate and drain electrodes of said third IGFET are connected in common with the gate and drain electrodes of said second IGFET to said output terminal.

6. In combination with a memory cell having at least one input-output (I/O) point and a single gating transistor having its conduction path connected between said I/O point and a single sense line, means for non-destructively reading the contents of the memory cell comprising:

first and second terminals for the application therebetween of an operating potential;

a voltage divider network connected between said first and second terminals having an output node for producing thereat a first voltage which is a ratio of said operating potential;

a self biased complementary inverter comprised of two transistors having their conduction paths connected in series between said output node and said second terminal; said inverter having an output terminal at which is produced a second voltage whose value is offset with respect to the first voltage by the threshold voltage of at least one of the transistors forming said inverter and by the ratio of the impedances of the inverter transistors; and means for selectively coupling said inverter output terminal to the control electrode of said gating transistor when the contents of the memory cell are to be read out.

7. The combination as claimed in claim 6 wherein said voltage divider network is comprised of at least three depletion type insulated-gate field-effect (IGFET) transistors having their conduction paths connected in series between said first and second terminals, and with circuit connections to their gate electrode for normally biasing the transistors into conduction.

8. The combination as claimed in claim 7 wherein said complementary inverter includes a first transistor of one conductivity and a second transistor of opposite conductivity type, and wherein the control electrodes of said first and second transistors are connected in common to their drains at said output terminal.

9. The combination as claimed in claim 6 wherein each depletion transistor has its gate electrode connected to its drain electrode.

10. The combination as claimed in claim 6 wherein said means for selectively coupling said inverter output terminal to the control electrode of said gating transistor includes a switch means for applying said second voltage to the control electrode of said gating transistor via a low impedance, during read out, and said switch means for applying a turn off voltage to said control electrode of said gating transistor when said memory cell is not selected.

* * * * *

UNITED STATES PATENT AND TRADEMARK OFFICE
CERTIFICATE OF CORRECTION

PATENT NO. : 4,156,940

DATED : May 29, 1979

INVENTOR(S) : R. J. Hollingsworth et al

It is certified that error appears in the above-identified patent and that said Letters Patent is hereby corrected as shown below:

Column 3, line 65 change "7/8" to --- 1/3 ---.

Column 4, line 20 change "7/8" to --- 1/3 ---.

Column 6, line 48 change "7/8" to --- 1/3 ---.

line 64 change "7/8" to --- 1/3 ---.

Column 7, line 52 change "7/8" to --- 1/3---.

*Signed and Sealed this*

*Ninth* Day of *October 1979*

[SEAL]

Attest:

RUTH C. MASON
*Attesting Officer*

LUTRELLE F. PARKER
*Acting Commissioner of Patents and Trademarks*